United States Patent
Naito

(10) Patent No.: US 11,158,733 B2
(45) Date of Patent: Oct. 26, 2021

(54) METHOD OF MANUFACTURING A SEMICONDUCTOR DEVICE INCLUDING A SHOULDER PORTION

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 16/695,179

(22) Filed: Nov. 26, 2019

(65) Prior Publication Data
US 2020/0098904 A1  Mar. 26, 2020

Related U.S. Application Data

(62) Division of application No. 15/256,634, filed on Sep. 5, 2016, now Pat. No. 10,505,028.

(30) Foreign Application Priority Data

Sep. 16, 2015  (JP) .............................. JP2015-183171
Jul. 8, 2016   (JP) .............................. JP2016-135985

(51) Int. Cl.
| | | |
|---|---|---|
| *H01L 29/739* | (2006.01) | |
| *H01L 29/06* | (2006.01) | |
| *H01L 29/66* | (2006.01) | |
| *H01L 21/265* | (2006.01) | |
| *H01L 29/10* | (2006.01) | |
| *H01L 29/423* | (2006.01) | |

(Continued)

(52) U.S. Cl.
CPC ...... *H01L 29/7397* (2013.01); *H01L 21/2253* (2013.01); *H01L 21/26586* (2013.01);
(Continued)

(58) Field of Classification Search
CPC .......... H01L 29/7397; H01L 29/66348; H01L 21/26586; H01L 29/063
(Continued)

(56) References Cited

U.S. PATENT DOCUMENTS

| | | |
|---|---|---|
| 5,729,032 A | 3/1998 | Tomomatsu et al. |
| 6,218,888 B1 | 4/2001 | Otsuki |

(Continued)

FOREIGN PATENT DOCUMENTS

| | | |
|---|---|---|
| JP | H8-255902 A | 10/1996 |
| JP | H09252126 A | 9/1997 |

(Continued)

OTHER PUBLICATIONS

Office Action issued for counterpart Japanese Application No. 2016-135985, issued by the Japan Patent Office dated Feb. 4, 2020 (drafted on Jan. 27, 2020).

*Primary Examiner* — Robert T Huber

(57) ABSTRACT

A semiconductor device including a semiconductor substrate; a trench formed in a front surface of the semiconductor substrate; a gate conducting portion formed within the gate trench; and a first region formed adjacent to the trench in the front surface of the semiconductor substrate and having a higher impurity concentration than the semiconductor substrate. A shoulder portion is provided on a side wall of the gate trench between the top end of the gate conducting portion and the front surface of the semiconductor substrate and has an average slope, relative to a depth direction of the semiconductor substrate, that is greater than a slope of the side wall of the gate trench at a position opposite the top end of the gate conducting portion, and a portion of the first region that contacts the gate trench is formed as a deepest portion thereof.

2 Claims, 16 Drawing Sheets

(51) Int. Cl.
*H01L 29/08* (2006.01)
*H01L 21/225* (2006.01)
*H01L 21/8234* (2006.01)

(52) U.S. Cl.
CPC ........ *H01L 29/063* (2013.01); *H01L 29/0638* (2013.01); *H01L 29/083* (2013.01); *H01L 29/1095* (2013.01); *H01L 29/4236* (2013.01); *H01L 29/42376* (2013.01); *H01L 29/66348* (2013.01); *H01L 21/823412* (2013.01); *H01L 21/823456* (2013.01); *H01L 21/823487* (2013.01)

(58) Field of Classification Search
USPC ................. 257/143, 586; 438/270
See application file for complete search history.

(56) References Cited

U.S. PATENT DOCUMENTS

| | | |
|---|---|---|
| 6,274,437 B1 | 8/2001 | Evans |
| 7,393,749 B2 | 7/2008 | Yilmaz |
| 2002/0056871 A1 | 5/2002 | Kocon |
| 2009/0114982 A1 | 5/2009 | Saka |
| 2010/0123191 A1* | 5/2010 | Kaneko ............... H01L 29/7813 257/331 |
| 2011/0062514 A1 | 3/2011 | Takano |
| 2011/0304054 A1 | 12/2011 | Sakai |
| 2013/0001679 A1 | 1/2013 | Omori |
| 2015/0021656 A1 | 1/2015 | Kitagawa |

FOREIGN PATENT DOCUMENTS

| | | |
|---|---|---|
| JP | H111508087 A | 7/1999 |
| JP | 2000252468 A | 9/2000 |
| JP | 3361874 B2 | 1/2003 |
| JP | 2004158680 A | 6/2004 |
| JP | 2007266133 A | 10/2007 |
| JP | 2011066121 A | 3/2011 |
| JP | 2012004156 A | 1/2012 |
| JP | 2012-238773 A | 12/2012 |
| JP | 2013012647 A | 1/2013 |
| JP | 2015038954 A | 2/2015 |
| JP | 2015095466 A | 5/2015 |

* cited by examiner

METHOD OF MANUFACTURING A SEMICONDUCTOR DEVICE INCLUDING A SHOULDER PORTION

CROSS-REFERENCE TO RELATED APPLICATIONS

This application is a divisional of U.S. patent application Ser. No. 15/256,634, filed on Sep. 5, 2016, which claims priority to Japanese Patent Applications No. 2015-183171, filed on Sep. 16, 2015, and No. 2016-135985, filed on Jul. 8, 2016, the contents of each of which are hereby incorporated herein by reference in their entirety.

BACKGROUND

1. Technical Field

The present invention relates to a semiconductor device and a manufacturing method.

2. Related Art

Conventionally, in a semiconductor device such as an IGBT, a trench gate structure is known, as shown in Patent Document 1, for example.
Patent Document 1: Japanese Patent Application Publication No. H08-255902

A semiconductor device such as an IGBT preferably has a prescribed threshold voltage corresponding to its function or the like.

SUMMARY

A semiconductor device according to a first aspect of the present invention may include a semiconductor substrate. The semiconductor device may include a gate trench and a gate conducting portion. The gate trench may be formed in a front surface of the semiconductor substrate. The gate conducting portion may be formed within the gate trench and provided such that a top end thereof is at a deeper position than the front surface of the semiconductor substrate. The gate trench may be insulated from the semiconductor substrate. The semiconductor device may include a first region that has a higher impurity concentration than the semiconductor substrate. The first region may be formed adjacent to the gate trench in the front surface of the semiconductor substrate. A shoulder portion may be provided on a side wall of the gate trench between the top end of the gate conducting portion and the front surface of the semiconductor substrate. The shoulder portion may have an average slope, relative to a depth direction of the semiconductor substrate, that is greater than a slope of the side wall of the gate trench at a position opposite the top end of the gate conducting portion.

The shoulder portion may have a convex curved surface portion that protrudes toward the inside of the semiconductor substrate. The portion of the first region contacting the gate trench may be a longest portion of the first region in the depth direction. A portion of an end surface of the gate conducting portion on the front surface side of the semiconductor substrate that contacts the side wall of the gate trench may be a portion of the end surface of the gate conducting portion formed closest to the front surface of the semiconductor substrate.

The side wall of the gate trench may have a portion forming an angle greater than or equal to 20 degrees relative to the depth direction of the semiconductor substrate at the shoulder portion. The gate trench may be provided extending in a predetermined extension direction in the front surface of the semiconductor substrate. A plurality of the first regions and a plurality of second regions, which have a different conduction type than the first region, may be provided in an alternating manner in the extension direction in a region adjacent to the gate trench in the front surface of the semiconductor substrate.

A plurality of the shoulder portions may be formed respectively in both a sidewall of the gate trench adjacent to a first region and a side wall of the gate trench adjacent to a second region. Portions of the second regions that contact the gate trench may be formed as the deepest portions of the second regions.

A plurality of the gate trenches that each have different distances from the front surface of the semiconductor substrate to the top end of the gate conducting portion may be formed in the semiconductor substrate. Depth of the first region adjacent to a gate trench having a greater distance from the front surface of the semiconductor substrate to the top end of the gate conducting portion may be greater than depth of the first region adjacent to a gate trench having a smaller distance from the front surface of the semiconductor substrate to the top end of the gate conducting portion. The semiconductor substrate may further include a third region that is formed on the back surface side of each of the first regions, has a different conduction type than the first regions, and has a bottom end with a uniform depth.

The gate trench may be provided extending in a predetermined extension direction in the front surface of the semiconductor substrate. The first region may be provided along the extension direction in a region adjacent to the gate trench in the front surface of the semiconductor substrate. The semiconductor device may further comprise a third region that is formed below the first region in the semiconductor substrate and has a different conduction type than the first region. The semiconductor device may further comprise a plug that penetrates through the first region and has a bottom end arranged within the third region. The semiconductor device may further comprise a second region that is formed in contact with the bottom end of the plug in the third region, has the same conduction type as the third region, and has a higher impurity concentration than the third region. The semiconductor device may further comprise an accumulation region that is formed below the third region in the semiconductor substrate and has a higher impurity concentration than the semiconductor substrate.

A manufacturing method according to a second aspect of the present invention may comprise forming a gate trench in a front surface of a semiconductor substrate. The manufacturing method may include forming a gate conducting portion that is provided within the gate trench, has a top end that is provided at a position deeper than the front surface of the semiconductor substrate, and is insulated from the semiconductor substrate. The manufacturing method may include forming a first region that is adjacent to the gate trench in the front surface of the semiconductor substrate and has a higher impurity concentration than the semiconductor substrate, by using the gate conducting portion as a mask and injecting impurities into a side wall of the gate trench. The forming the gate trench may include providing, on a side wall of the gate trench between the top end of the gate conducting portion and the front surface of the semiconductor substrate, a shoulder portion that has an average slope, relative to a depth direction of the semiconductor substrate, that is greater than a slope of the side wall of the gate trench at a position opposite the top end of the gate conducting portion. A portion of the first region that contacts the gate trench may be formed as a deepest portion of the first region.

The forming the first region may include injecting impurities into the side wall of the gate trench from a direction having a slope relative to the depth direction of the semiconductor substrate. The forming the gate trench and the forming the gate conducting portion may include forming, in the semiconductor substrate, a plurality of the gate trenches that have different distances from the front surface of the semiconductor substrate to the top end of the gate conducting portion. The forming the first region may include forming the first region with a depth corresponding to the distance from the front surface of the semiconductor substrate to the top end of the gate conducting portion.

The forming the gate trench may include forming a plurality of the gate trenches with different depths. The forming the gate conducting portion may include forming a plurality of the gate conducting portions with the same length respectively in the gate trenches.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
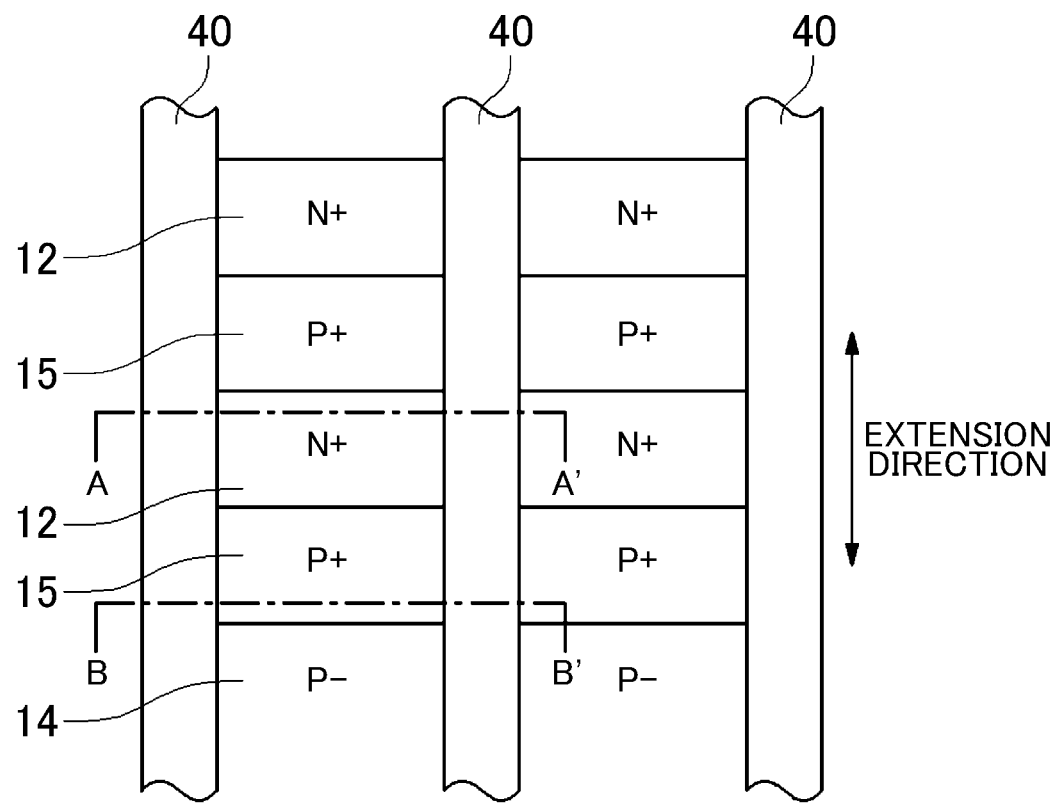
FIG. 1 shows a portion of a front surface of a semiconductor device 100 according to a first embodiment.

FIG. 1 shows a portion of a front surface of a semiconductor device 100 according to a first embodiment. The semiconductor device 100 of this example includes a plurality of gate trench portions 40 that extend in a prescribed extension direction in the front surface of the semiconductor substrate. The gate trench portions 40 are arranged at prescribed intervals along an arrangement direction that is orthogonal to the extension direction. The gate trench portions 40 function as gates of power semiconductor elements such as IGBTs, for example.

A P− type base region 14 is formed in the regions sandwiched between respective gate trench portions 40 on the front surface of the semiconductor substrate. A P+ type contact region 15 is formed on the front surface of the base region 14. An N+ type emitter region 12 is selectively formed on a portion of the front surface of the contact region 15. The emitter region 12 is an example of a first region. The contact region 15 is an example of a second region. The base region 14 is an example of a third region. Each region may have a conduction type that is the opposite of the conduction type used in the description provided in this Specification.

In this example, the contact region 15 and the emitter region 12 are each formed from a gate trench portion 40 adjacent on one side to a gate trench portion 40 adjacent on the other side. A plurality of the contact regions 15 and the emitter regions 12 are formed to be exposed in an alternating manner along the extension direction of the gate trench portions 40 in the region sandwiched between respective gate trench portions 40.

The emitter regions 12 may be formed along the extension direction on both sides of each gate trench portion 40, and the contact regions 15 may be formed in the regions sandwiched by the emitter regions 12. An interlayer insulating film, an emitter electrode, and the like are formed on the front surface of the semiconductor device 100, but are not shown in FIG. 1.

Figure 2:
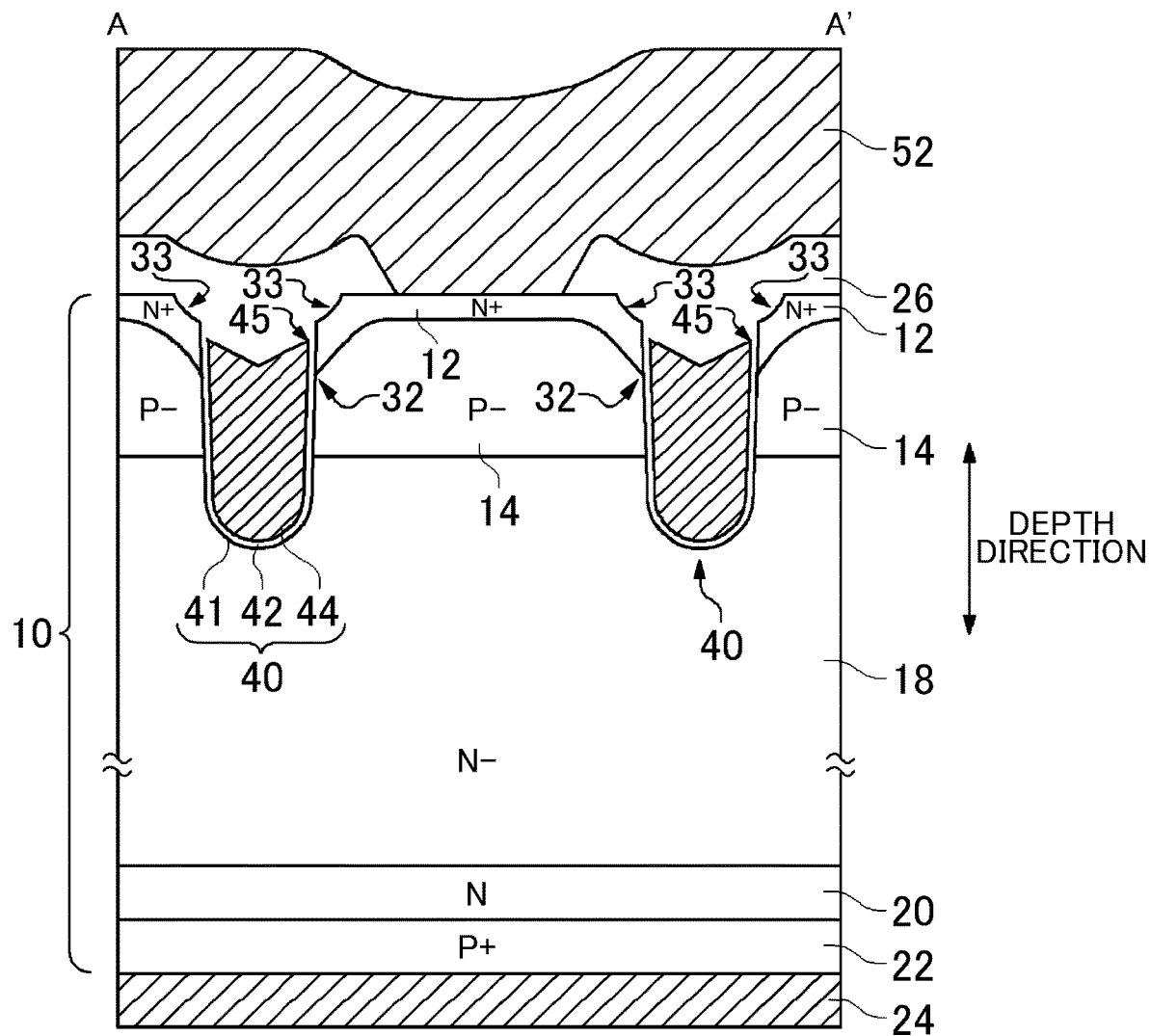
FIG. 2 shows the A-A' cross section from FIG. 1.

FIG. 2 shows the A-A' cross section from FIG. 1. The A-A' cross section is perpendicular to the front surface of the semiconductor device 100 and also perpendicular to the extension direction of the gate trench portions 40. The semiconductor device 100 includes a semiconductor substrate 10, an interlayer insulating film 26, an emitter electrode 52, and a collector electrode 24 in this cross section.

The interlayer insulating film 26 is formed with a prescribed pattern on the front surface of the semiconductor substrate 10. The interlayer insulating film 26 covers an opening portion of the gate trench portion 40 and exposes at least a portion of a mesa region sandwiched between gate trench portions 40. The interlayer insulating film 26 is a PSG film or BPSG film, for example. The emitter electrode 52 is formed above the interlayer insulating film 26. The emitter electrode 52 contacts the portion of the front surface of the semiconductor substrate 10 that is not covered by the interlayer insulating film 26.

The collector electrode 24 is formed on the back surface of the semiconductor substrate 10. The emitter electrode 52 and the collector electrode 24 are formed of a conductive material such as metal. In this Specification, the surfaces of the components such as the substrate, layers, and regions that are on the emitter electrode 52 side are referred to as front surfaces or top surfaces, and the surfaces of components on the collector electrode 24 side are referred to as back surfaces or bottom surfaces. A direction that connects the emitter electrode 52 and the collector electrode 24 is referred to as the depth direction. Furthermore, a direction from the collector electrode 24 toward the emitter electrode 52 is referred to as up, and a direction from the emitter electrode 52 toward the collector electrode 24 is referred to as down.

The semiconductor substrate 10 may be a silicon substrate, and may be a silicon carbide substrate, a nitride semiconductor substrate, or the like. The P– type base region 14 is formed on the front surface side of the semiconductor substrate 10. The N+ type emitter region 12 is selectively formed in a partial region on the front surface side of the base region 14.

The semiconductor substrate 10 further includes an N– type drift region 18, an N– type buffer region 20, and a P+ type collector region 22. The drift region 18 is formed on the back surface side of the base region 14.

The buffer region 20 is formed on the back surface side of the drift region 18. The impurity concentration of the buffer region 20 is higher than the impurity concentration of the drift region 18. The buffer region 20 may function as a field stop layer that prevents the depletion layer, which spreads from the back surface side of the base region 14, from reaching the collector region 22. The collector region 22 is formed on the back surface side of the buffer region 20. Furthermore, the collector electrode 24 is provided on the back surface of the collector region 22.

One or more gate trench portions 40 are formed on the front surface side of the semiconductor substrate 10. Each gate trench portion 40 penetrates through the base region 14 from the front surface of the semiconductor substrate 10 and reaches the drift region 18. The gate trench portions 40 in this cross section penetrate through the emitter region 12 and the base region 14 from the front surface of the semiconductor substrate 10 and reach the drift region 18.

Each gate trench portion 40 includes a gate trench 41 formed on the front surface side of the semiconductor substrate 10, an insulating film 42, and a gate conducting portion 44. The insulating film 42 is formed covering the inner walls of the gate trench 41. The insulating film 42 may be formed by oxidizing or nitriding the semiconductor material of the inner walls of the gate trench 41. The gate conducting portion 44 is formed farther inward in the gate trench 41 than the insulating film 42. In other words, the insulating film 42 provides insulation between the gate conducting portion 44 and the semiconductor substrate 10. The gate conducting portion 44 is formed of a conductive material such as polysilicon.

A top end 45 of the gate conducting portion 44 is arranged at a position deeper than the front surface of the semiconductor substrate 10. In other words, the top end 45 of the gate conducting portion 44 is sunken into the gate trench 41. The top end 45 of the gate conducting portion 44 refers to the end portion of the gate conducting portion 44 that is farthest upward.

The interlayer insulating film 26 is formed in the region where the gate conducting portion 44 and the insulating film 42 are not provided within the gate trench 41. In this way, the gate conducting portion 44 is insulated from the emitter electrode 52. It should be noted that the gate trench portion 40 is provided extending to a position below the metal gate electrode in the semiconductor device 100. A contact hole that electrically connects the gate conducting portion 44 and the gate electrode is formed in the interlayer insulating film 26 below the gate electrode.

The gate conducting portion 44 includes a region opposite at least the adjacent base region 14. When a prescribed voltage is applied to the gate conducting portion 44, a channel is formed in the front layer of the base region 14 that is the boundary where the base region 14 contacts the gate trench 41.

The semiconductor device 100 may be provided with dummy trench portions in place of some of the gate trench portions 40. A dummy trench portion has the same structure as a gate trench portion 40. However, the conducting portion within the dummy trench portion is electrically connected to the emitter electrode 52. In this case, a contact hole is provided in the interlayer insulating film 26 between the dummy trench portion and the emitter electrode 52. By providing the dummy trench portion, the injection enhancement effect (IE effect) for the injection of carriers into the drift region can be increased and the ON voltage can be reduced.

In the cross section in the depth direction of the semiconductor substrate 10, the average slope of the side walls of the gate trench 41 between the front surface of the semiconductor substrate 10 and the top end 45 of the gate conducting portion 44 is greater than the slope of the side walls at positions opposite the top end 45 of the gate conducting portion 44. Unless explicitly stated otherwise, the term "slope" in this Specification refers to the slope relative to the depth direction of the semiconductor substrate 10 in this cross section. For example, the "slope" of the front surface of the semiconductor substrate 10 is approximately 90 degrees, and the "slope" of a straight line parallel to the depth direction is 0 degrees. The average slope of a side wall of the gate trench 41 within a prescribed range may be calculated by integrating the slope of the side wall of the gate trench 41 in this cross section over a prescribed length of the side wall of the gate trench 41, and then dividing the resulting integrated value by this prescribed length.

The gate trench 41 of this example has a shoulder portion 33 in a region contacting the front surface of the semiconductor substrate 10. The shoulder portion 33 is formed on the side walls of the gate trench 41 between the gate conducting portion 44 and the front surface of the semiconductor substrate 10, i.e. formed above the top end 45 of the gate conducting portion 44. In this cross section, the average slope of the side wall of the gate trench 41 at the shoulder portion 33 is less than the slope of the side wall at a position opposite the top end 45 of the gate conducting portion 44. The slope of the side walls of the gate trench 41 between the shoulder portion 33 and the top end 45 of the gate conducting portion 44 may be substantially equal to the slope of the side walls of the gate trench 41 at a position opposite the top end 45 of the gate conducting portion 44.

In this way, by increasing the slope of the side walls of the gate trench 41 above the top end 45 of the gate conducting portion 44, it becomes easier to control the depth of the emitter region 12 in the region contacting the gate trench 41. By controlling the depth of the emitter region 12, it is possible to control the length of the base region 14 that remains. The length of the base region 14 contacting the gate trench 41 is equivalent to the channel length. Therefore, it becomes easier to control the threshold voltage of the semiconductor device 100.

Figure 3:
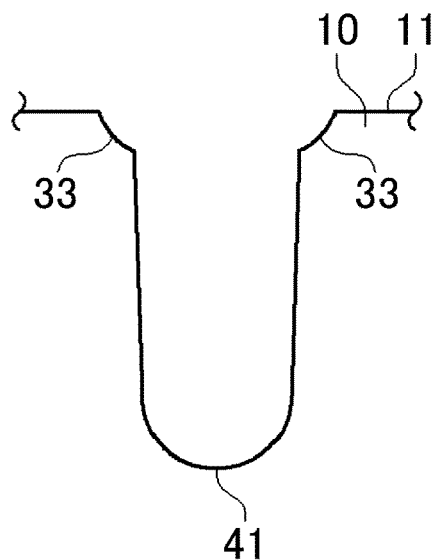
FIG. 3 is a drawing for describing a portion of the manufacturing process of the gate trench portion 40 and the emitter region 12 in the semiconductor device 100.
Figure 3:
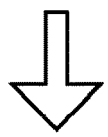
Figure 3:
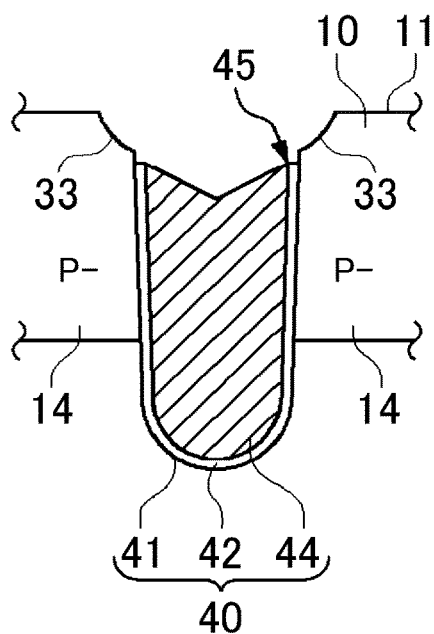
Figure 3:
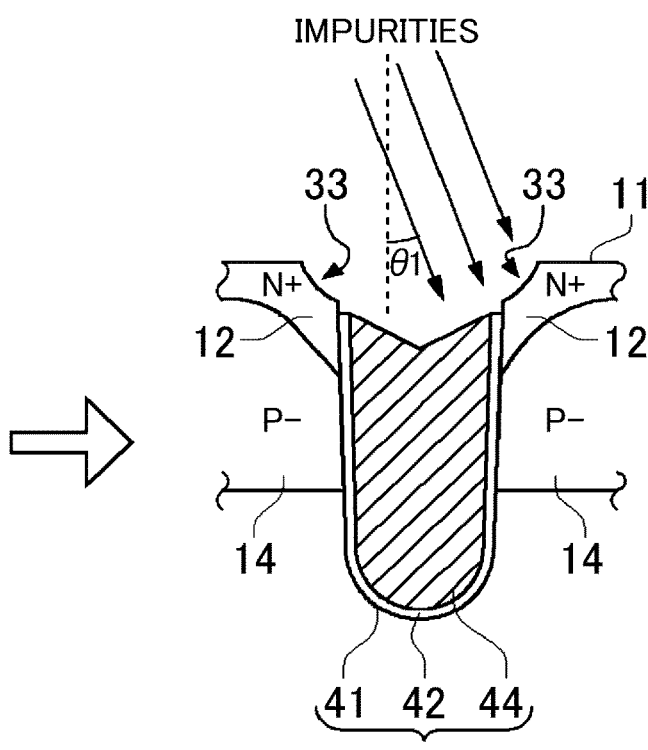

FIG. 3 is a drawing for describing a portion of the manufacturing process of the gate trench portion 40 and the emitter region 12 in the semiconductor device 100. First, in a gate trench forming step S300, the gate trench 41 is formed in the front surface of the semiconductor substrate 10. The gate trench 41 has a shoulder portion 33 in the region contacting the front surface of the semiconductor substrate 10. For example, the gate trench 41 including the shoulder portion 33 may be formed by etching the front surface of the semiconductor substrate 10 using a first mask with a prescribed opening to form a trench, and then wet etching the front surface of the semiconductor substrate 10 using a second mask with a larger opening than the first mask. The second mask may be formed by wet etching the first mask to expand the area of the opening.

Next, in a gate conducting portion forming step S302, the insulating film 42 and the gate conducting portion 44 are formed on the inner wall of the gate trench 41. The insulating film 42 may be formed by oxidizing the semiconductor substrate 10. The gate conducting portion 44 is formed such that the top end 45 of the gate conducting portion 44 is at a position deeper than the front surface 11 of the semiconductor substrate 10. In this example, the top end 45 of the gate conducting portion 44 is provided farther down than the shoulder portion 33. The gate conducting portion 44 is formed of polysilicon doped with impurities, for example.

After the gate conducting portion 44 is formed, P type impurities are injected into and diffused through the front surface of the semiconductor substrate 10 to form the base region 14. The P type impurities are boron, for example. The diffusion temperature of the base region 14 is approximately 1100 degrees C., for example. The gate trench portion 40 may be formed after forming the base region 14.

Next, in an emitter region forming step S304, N type impurities are injected into and diffused through the semiconductor substrate 10. The N type impurities are arsenic, for example. Furthermore, P type impurities such as boron are injected into and diffused through the contact region 15. The impurities of the emitter region 12 and the contact region 15 may be diffused in the same step. The temperature for the diffusion step may be lower than the diffusion temperature of the base region 14. The temperature for the diffusion step may be less than or equal to 1000 degrees C., for example.

In this way, the emitter region 12 is formed. In S304, the impurities are injected not only into the front surface of the semiconductor substrate 10, but also into the side walls of the gate trench 41 using the gate conducting portion 44 as a mask. With this method, the emitter region 12 is formed such that the portion thereof contacting the gate trench 41 is the deepest portion.

In S304, the N type impurities are diffused in the region contacting the gate trench 41 up to a depth corresponding to the threshold voltage that the semiconductor device 100 is to have. If the impurities are to be diffused to a deeper position, thermal processing at a higher temperature or for a longer time is necessary. It should be noted that, since the manufacturing efficiency is worsened when thermal processing is performed for a long time, thermal processing at a high temperature is preferable. However, when thermal processing is performed at a high temperature, the length across which the impurities are diffused per unit time is increased, and therefore it is difficult to control the diffusion depth of the impurities.

In contrast to this, with the semiconductor device 100 and manufacturing method of this example, since the gate trench 41 includes the shoulder portion 33, it is possible to reduce the length across which the impurities are diffused in the region contacting the gate trench 41. In other words, in the region where the shoulder portion 33 is provided, the impurities are injected further downward than the front surface 11 of the semiconductor substrate 10. Therefore, when forming the emitter region 12 with a prescribed depth, it is possible to reduce the length across which the impurities are diffused.

Therefore, even though the impurities are diffused at a lower temperature, the thermal processing time does not become longer and the manufacturing efficiency is not worsened. Since the impurities are diffused at a low temperature, it is possible to accurately control the depth of the emitter region 12 in the region contacting the gate trench 41.

By having the gate trench 41 include the shoulder portion 33, it is possible to reduce the surface area of the mesa region sandwiched between gate trench portions 40. Therefore, it is possible to realize the injection enhancement effect (IE effect).

At S304, the impurities may be injected into the side walls of the gate trench 41 from a direction with a prescribed slope $\theta 1$ relative to the depth direction of the semiconductor substrate 10. In this way, the impurities can be injected efficiently. The slope $\theta 1$ is less than or equal to 10 degrees, for example.

The emitter region 12 is formed in a self-aligning manner, with the gate conducting portion 44 acting as a mask, and therefore the emitter region 12 can be easily made to contact the gate trench portion 40. On the other hand, if the emitter region 12 is formed using a mask that is independent from the gate trench portion 40, there are cases where the emitter region 12 and the gate trench portion 40 are not in contact with each other due to manufacturing variations during mask alignment or the like, which results in the semiconductor device 100 being unable to operate.

Figure 4:
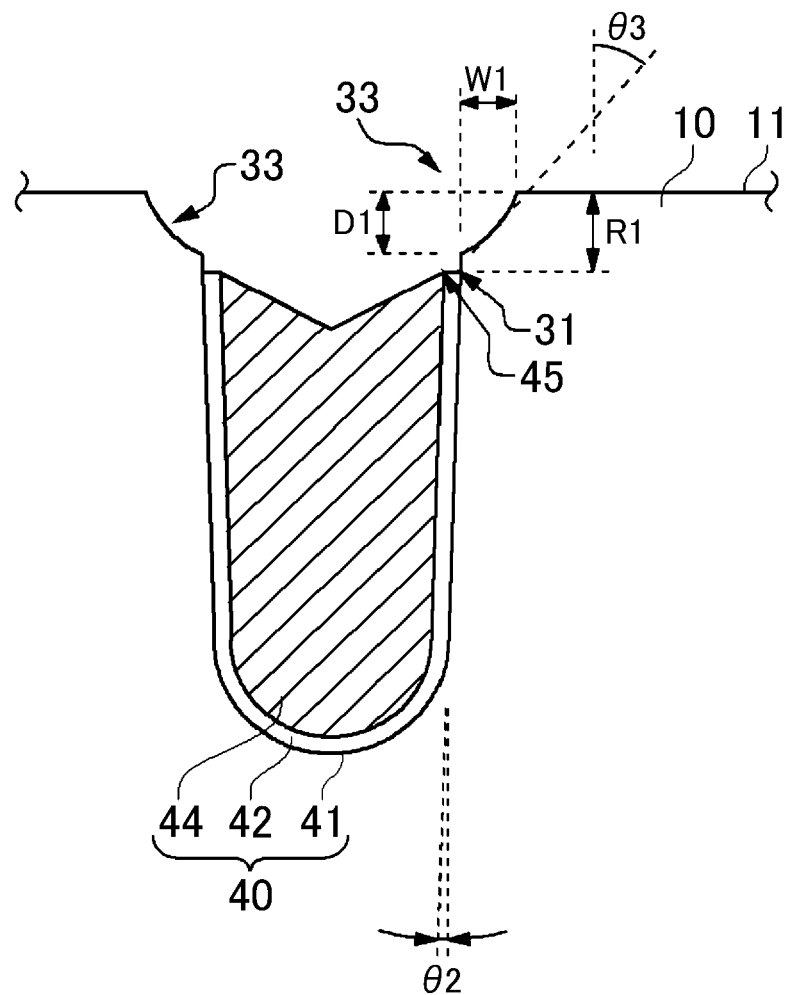
FIG. 4 is a drawing for describing the shape of the gate trench portion 40.

FIG. 4 is a drawing for describing the shape of the gate trench portion 40. In this example, the slope of the side walls of the gate trench 41 at a position 31 opposite the top end 45 of the gate conducting portion 44 is $\theta 2$. Furthermore, the width of the shoulder portion 33 in the radial direction of the opening of the gate trench 41 is W1 and the length in the depth direction is D1. The start point of the shoulder portion 33 may be an end portion of a side walls of the gate trench 41 at the front surface 11 of the semiconductor substrate 10. The end point of the shoulder portion 33 may be a position where the slope of the side walls of the gate trench 41 is greater than $\theta 2$ by at least a prescribed value, when tracing a path along the side walls of the gate trench 41 from the position 31 toward the front surface 11 of the semiconductor substrate 10. This prescribed value is 10 degrees, for example. The prescribed value may instead be 0 degrees, 20 degrees, or 30 degrees.

The shoulder portion 33 may have a convex curved surface portion that protrudes toward the inside of the semiconductor substrate 10. In other words, the slope of the shoulder portion 33 increases as the distance from the front surface of the semiconductor substrate 10 becomes greater. As a result of this shape of the shoulder portion 33, it is possible to more efficiently inject the impurities to a deep position. Therefore, it is possible to shorten the diffusion length of the impurities for forming the emitter region 12 at the prescribed depth.

The length D1 of the shoulder portion 33 may be greater than the width W1. In this way, it is possible to miniaturize and reduce the area of the opening of the gate trench 41 and to inject the impurities to a deep position in the region adjacent to the gate trench 41. Instead, the length D1 may be equal to the width W1 or less than the width W1.

The width W1 of the shoulder portion 33 may be less than or equal to half of the width of the gate trench 41 at the position 31, or may be less than or equal to ¼ of the width of the gate trench 41 at the position 31. In this way, it is possible to restrict the increase in the area of the gate trench 41 in the front surface 11 of the semiconductor substrate 10. Furthermore, the width W1 may be greater than or equal to 1/20 of the width of the gate trench 41 at the position 31, or may be greater than or equal to 1/10 of the width of the gate trench 41 at the position 31. In this way, it is possible to efficiently inject the impurities to a deep position.

The length D1 of the shoulder portion 33 may be less than or equal to half of a distance R1 between the top end 45 of the gate conducting portion 44 and the front surface 11 of the semiconductor substrate 10. Instead, the length D1 may be greater than half of the distance R1. Instead, the length D1 may be approximately equal to the distance R1. As an example, if the length D1 is greater than or equal to 90% of the distance R1 and less than or equal to 110% of the distance R1, then the length D1 is considered to be approximately equal to the distance R1.

The side walls of the gate trench 41 have a portion with a slope greater than or equal to 20 degrees in a region between the top end 45 of the gate conducting portion 44 and the front surface 11 of the semiconductor substrate 10. For example, the slope θ3 of at least a portion of the shoulder portion 33 is greater than or equal to 20 degrees. In this way, by increasing the slope of the side walls of the gate trench 41 in a region farther upward than the top end 45, it is possible to efficiently inject the impurities to a deep position and it becomes easy to restrict the diffusion of the impurities in the region adjacent to the gate trench 41.

Figure 5:
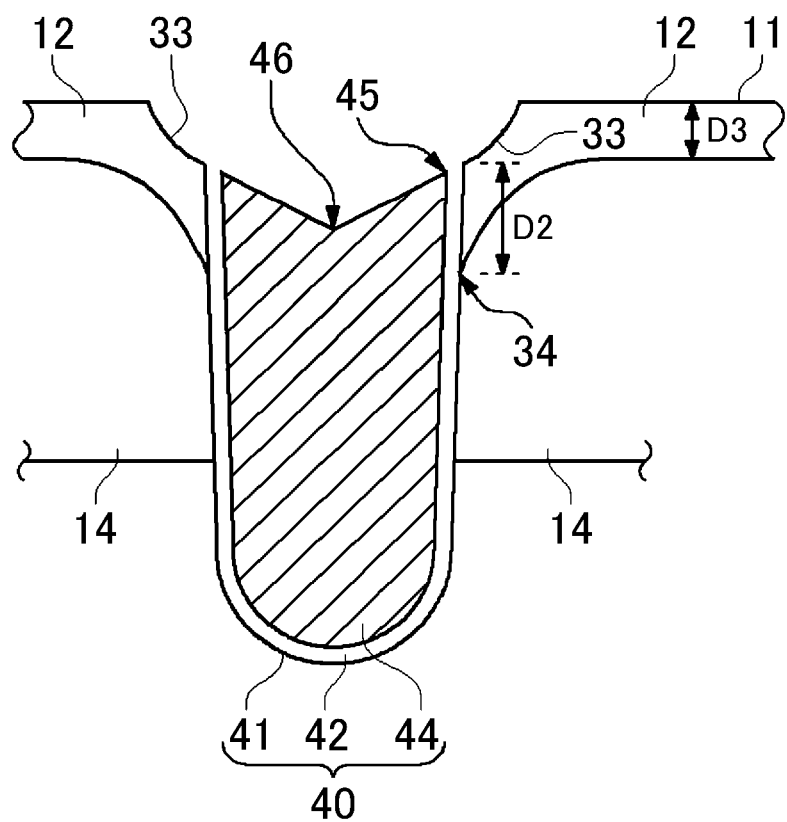
FIG. 5 is a drawing for describing the shapes of the emitter region 12 and the gate conducting portion 44.

FIG. 5 is a drawing for describing the shapes of the emitter region 12 and the gate conducting portion 44. As described above, the impurities are also injected from the inner walls of the gate trench 41, and therefore the bottom end 34 (32 in FIG. 2) of a portion of the emitter region 12 adjacent to the gate trench 41 is provided at a position deeper than other portions thereof. With this shape, it is possible to control the length of the base region 14 in the region adjacent to the gate trench 41 and to control the threshold voltage of the semiconductor device 100.

The length D2 of the portion of the emitter region 12 contacting the gate trench 41 in the depth direction may be greater than the length of other portions of the emitter region 12. For example, the length D3 of the emitter region 12 in the mesa region where the gate trench 41 is not provided may be less than the length D2.

The end surface of the gate conducting portion 44 on the front surface 11 side of the semiconductor substrate 10 has a portion thereof that is adjacent to the side walls of the gate trench 41 (the top end 45 in this example) formed closest to the front surface 11 of the semiconductor substrate 10. In this example, the portion 46 of the end surface of the gate conducting portion 44 on the front surface 11 side of the semiconductor substrate 10 that is positioned at the center of the gate trench 41 is formed at a position farthest away from the front surface 11 of the semiconductor substrate 10.

As an example, this end surface of the gate conducting portion 44 becomes gradually farther away from the front surface of the semiconductor substrate 10 along a direction from a side wall of the gate trench 41 toward the center of the gate trench 41. In other words, the thickness of the gate conducting portion 44 adjacent to the side wall of the gate trench 41 gradually increases as the depth from the front surface 11 of the semiconductor substrate 10 increases. As described above, if the impurities are injected diagonally with the gate conducting portion 44 as a mask, the location where the thickness of the gate conducting portion 44 is small is where the impurities pass through the gate conducting portion 44 to be injected into the semiconductor substrate 10. In this way, in the region adjacent to the gate trench 41, it is possible to easily inject and diffuse the impurities to a deep position as seen from the front surface 11 of the semiconductor substrate 10.

Figure 6A:
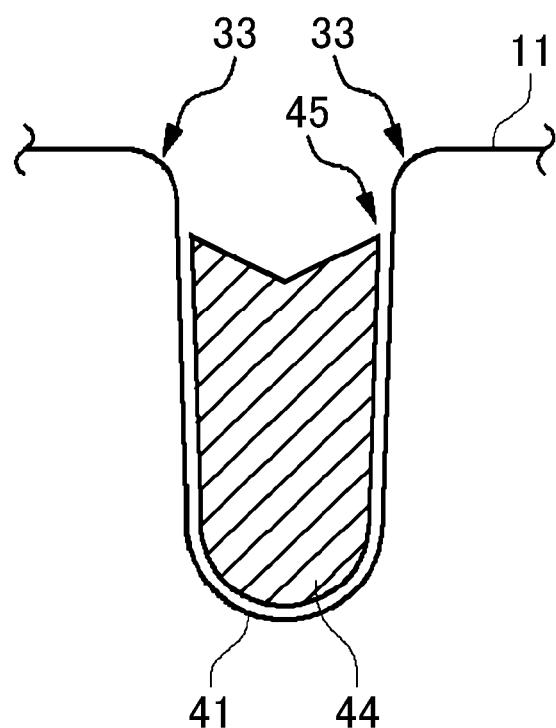
FIG. 6A shows a modification of the shape of the shoulder portion 33.

FIG. 6A shows a modification of the shape of the shoulder portion 33. The shoulder portion 33 of this example includes a convex curved portion that protrudes toward the front surface side of the semiconductor substrate 10. In other words, the slope of the shoulder portion 33 of this example decreases as the distance from the front surface of the semiconductor substrate 10 increases. With this shape as well, it is possible to easily diffuse the impurities to a deep position as seen from the front surface 11 of the semiconductor substrate 10.

Figure 6B:
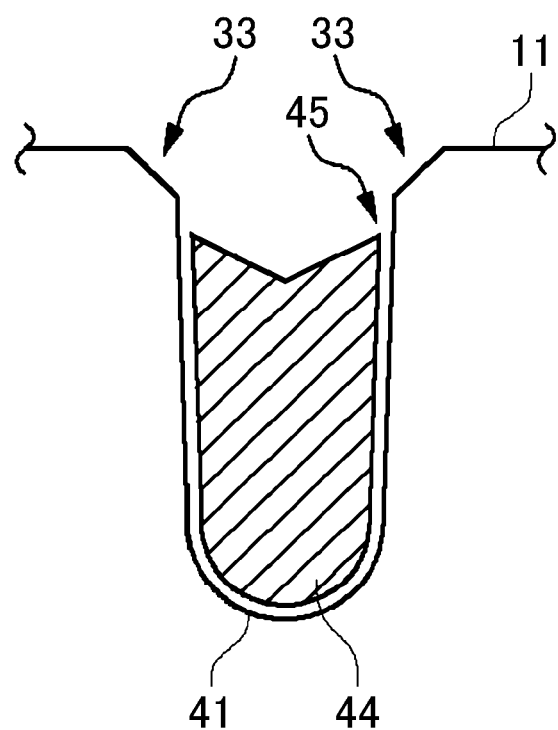
FIG. 6B shows a modification of the shape of the shoulder portion 33.

FIG. 6B shows a modification of the shape of the shoulder portion 33. The shoulder portion 33 of this example has a linear shape in at least a portion thereof. This linear shape has a slope that is greater, by at least a prescribed value, than the slope θ2 of the side walls of the gate trench 41 at a position opposite the top end 45 of the gate conducting portion 44. This prescribed value may be 10 degrees, 20 degrees, or 30 degrees. With this shape as well, it is possible to easily diffuse the impurities to a deep position as seen from the front surface 11 of the semiconductor substrate 10.

Figure 7:
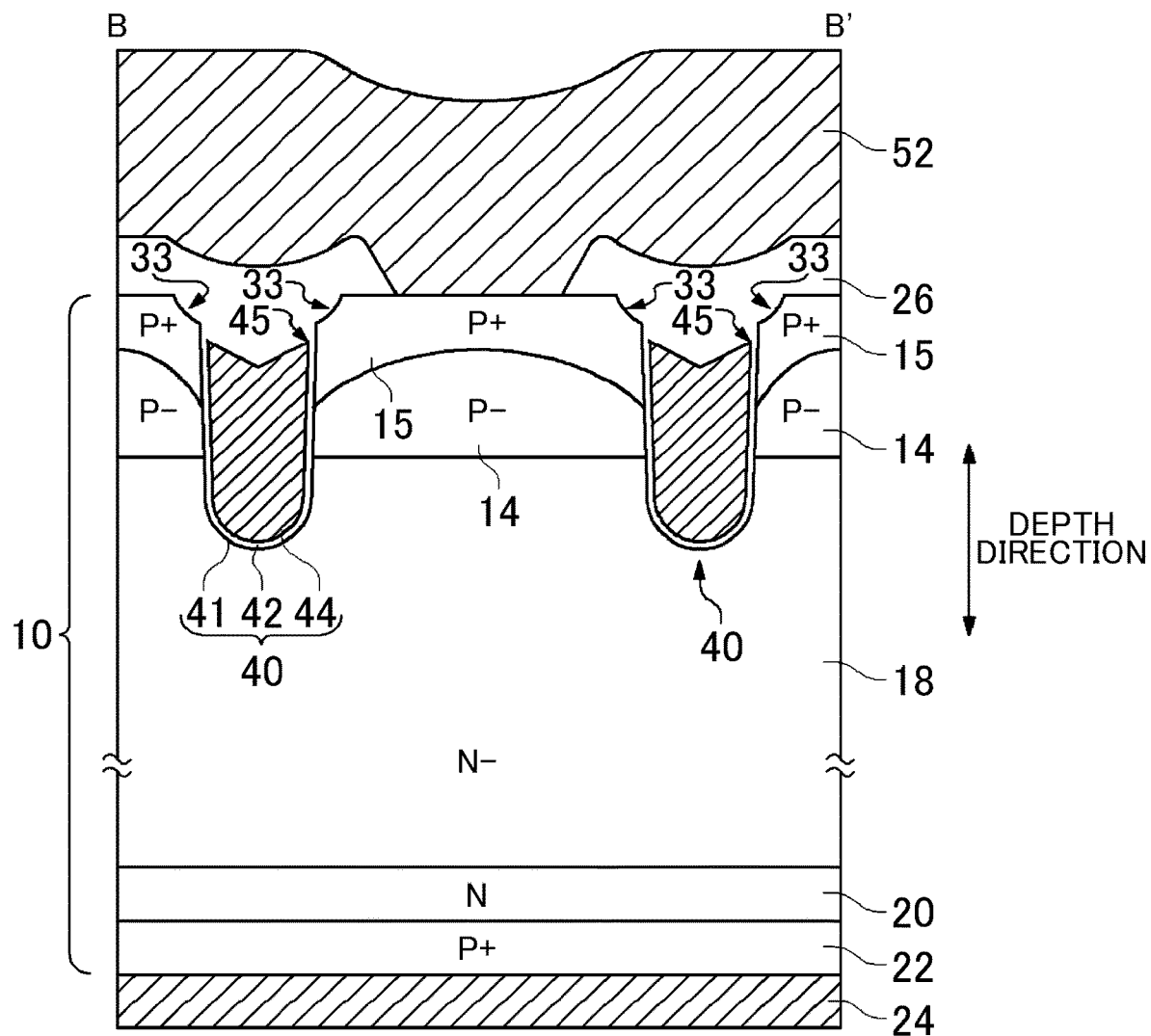
FIG. 7 shows the B-B' cross section from FIG. 1.

FIG. 7 shows the B-B' cross section from FIG. 1. In this cross section, the semiconductor device 100 has a contact region 15 instead of the emitter region 12 in the cross section shown in FIG. 2. The remaining structure of the semiconductor device 100 is the same as shown in the cross section of FIG. 2.

In other words, the gate trench 41 has a shoulder portion 33 in both a region adjacent to the emitter region 12 and a region adjacent to the contact region 15. The shoulder portion 33 in the region adjacent to the emitter region 12 and the shoulder portion 33 in the region adjacent to the contact region 15 may have the same shape.

With this structure, it is possible to control the depth of the contact region 15 in the same manner as the depth of the emitter region 12. In other words, a portion of the contact region 15 in contact with the gate trench 41 is also formed to the deepest position.

Figure 8:
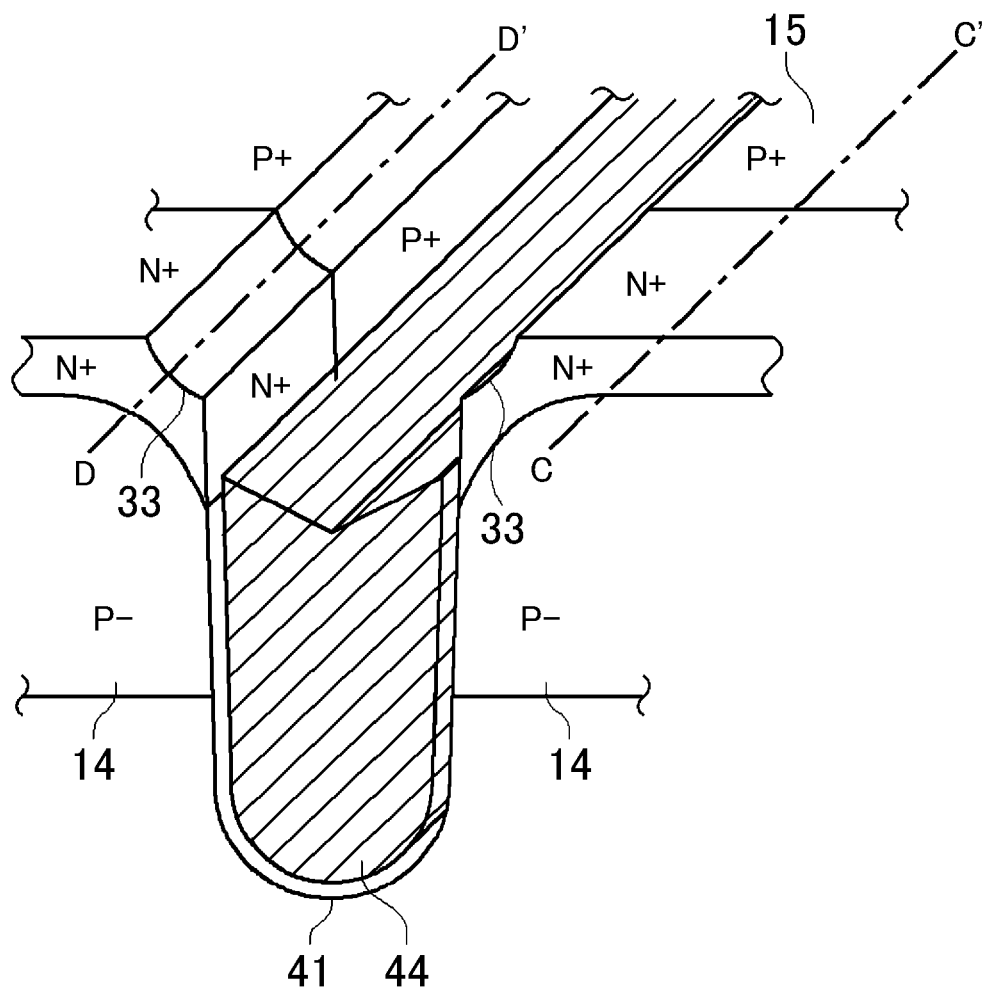
FIG. 8 is a perspective view of the gate trench 41, the gate conducting portion 44, the emitter region 12, and the contact region 15.

FIG. 8 is a perspective view of the gate trench 41, the gate conducting portion 44, the emitter region 12, and the contact region 15. The shoulder portion 33 is formed extending along the extension direction of the gate trench 41.

Figure 9A:
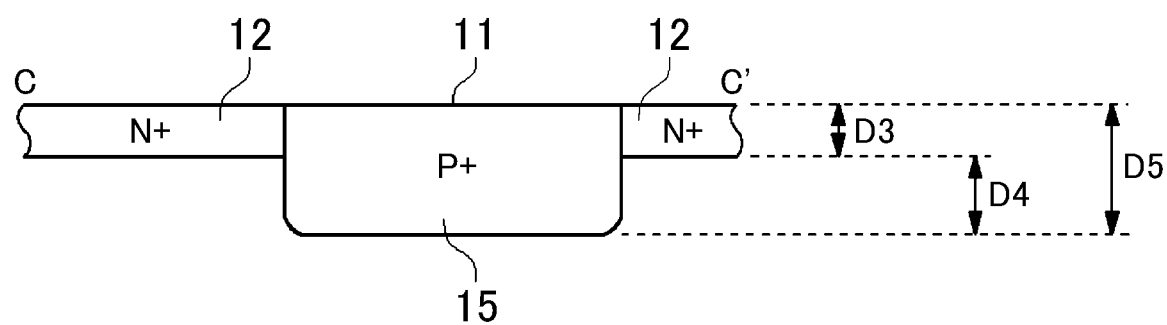
FIG. 9A shows the C-C' cross section from FIG. 8.

FIG. 9A shows the C-C' cross section from FIG. 8. This cross section is taken along the extension direction of the gate trench 41 in the region where the gate trench 41 is not provided, i.e. in the mesa region. As described above, a plurality of emitter regions 12 and contact regions 15 are exposed in an alternating manner in the front surface 11 of the semiconductor substrate 10 along the extension direction of the gate trench 41. The contact regions 15 are formed to deeper positions than the emitter regions 12.

Figure 9B:
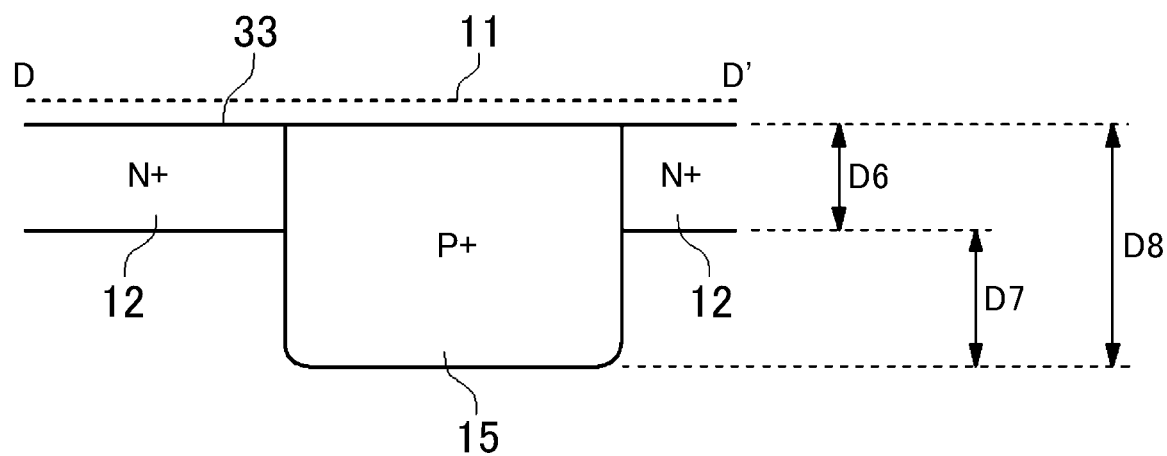
FIG. 9B shows the D-D' cross section from FIG. 8.

FIG. 9B shows the D-D' cross section from FIG. 8. This cross section is taken along the extension direction of the gate trench 41 in the region where the shoulder portion 33 is provided. The emitter region 12 in the shoulder portion 33 is formed to a deeper position than the emitter region 12 in the mesa region shown in FIG. 9A. The contact region 15 in the shoulder portion 33 is formed to a deeper position than the contact region 15 in the mesa region. During turn-off state, holes can pass through from the contact region 15 in the shoulder portion 33, so that a latch-up can be suppressed.

The length D6 in the depth direction of the emitter region 12 in the shoulder portion 33 is greater than the length D3 of the emitter region 12 in the mesa region. The length D8 in the depth direction of the contact region 15 in the shoulder portion 33 is greater than the length D5 of the contact region 15 in the mesa region. The length difference D7 between the emitter region 12 and the contact region 15 in the shoulder portion 33 is greater than or equal to the length difference D4 between the emitter region 12 and the contact region 15 in the mesa region.

Figure 10:
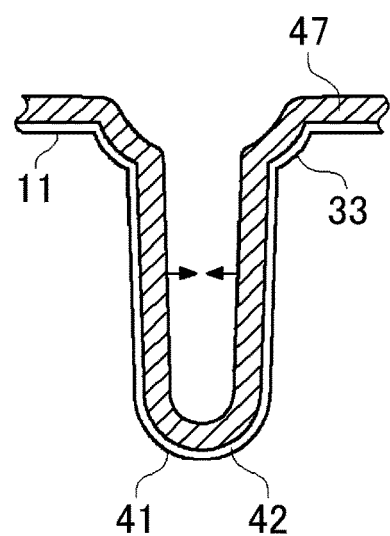
FIG. 10 shows an exemplary manufacturing process of the gate conducting portion 44.
Figure 10:
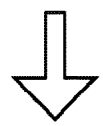
Figure 10:
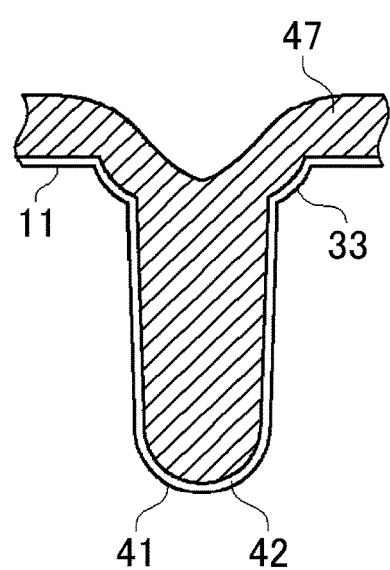

FIG. 10 shows an exemplary manufacturing process of the gate conducting portion 44. First, the gate trench 41 including the shoulder portion 33 is formed in the front surface 11 of the semiconductor substrate 10. Next, the insulating film 42 is formed on the gate trench 41 and the front surface of the semiconductor substrate 10. Next, the conductive material 47 is deposited on the gate trench 41 and the front surface of the semiconductor substrate 10. As the conductive material 47 is deposited, the thickness of the conductive material 47 deposited on the side walls within the gate trench 41 increases. Furthermore, the thickness of the conductive material 47 increases while maintaining the shape along the shoulder portion 33.

When the conductive material 47 has filled the gate trench 41 up to the center thereof, the conductive material 47 above the opening of the gate trench 41 has a convex shape protruding downward, as shown in the bottom portion of FIG. 10. Then, by etching the conductive material 47 to a prescribed depth within the gate trench 41, the gate conducting portion 44 such as shown in FIG. 5 is formed. In this way, by having the gate trench 41 include the shoulder portion, it is possible to easily form the convex gate conducting portion 44 whose top surface protrudes downward. Therefore, it is possible to easily inject the impurities into the side surfaces of the gate trench 41.

Figure 11:
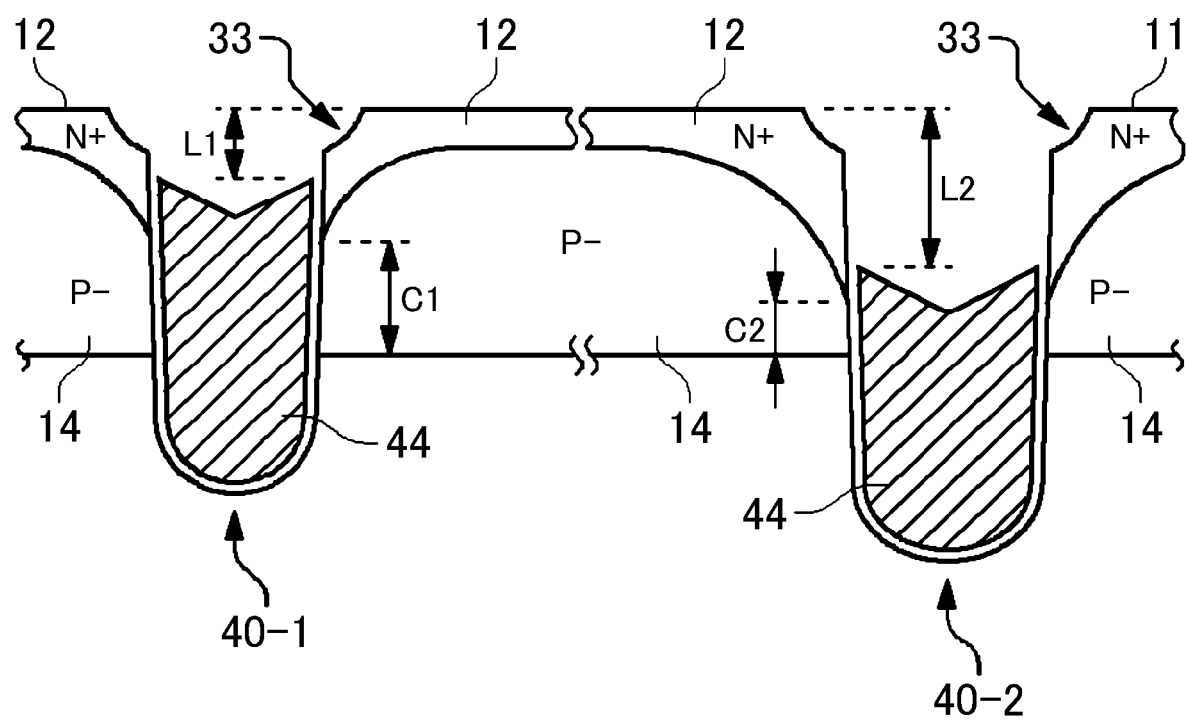
FIG. 11 shows a cross section of a semiconductor device 100 according to a second embodiment.

FIG. 11 shows a cross section of a semiconductor device 100 according to a second embodiment. The semiconductor device 100 of this example includes a plurality of gate trench portions 40 having different distances from the front surface 11 of the semiconductor substrate 10 to the top ends of the gate conducting portions 44. In other words, a plurality of gate trench portions 40 are included that each have a difference depth for the top end of the gate conducting portion 44. Each gate trench portion 40 penetrates through the base region 14 whose bottom end has a uniform depth. Furthermore, the cross section exhibited by each gate trench portion 40 needs not be a single plane.

When the depths of the top ends of the gate conducting portions 44 are different, the depths of the emitter regions 12 in the regions adjacent to the gate trenches 41 are also different. Specifically, when the top end of a gate conducting portion 44 is shallower, the emitter region 12 is also shallower, and when the top end of a gate conducting portion 44 is deeper, the emitter region 12 is also deeper.

In this example, the distance between the top end of the gate conducting portion 44 in a first gate trench portion 40-1 and the front surface 11 of the semiconductor substrate 10 is L1. Furthermore, the distance between the top end of the gate conducting portion 44 in a second gate trench portion 40-2 and the front surface 11 of the semiconductor substrate 10 is L2. The distance L1 is less than the distance L2.

As described above, when the distance between the top end of the gate conducting portion 44 and the front surface 11 of the semiconductor substrate 10 is greater, the emitter region 12 adjacent to the gate trench 41 is deeper and the channel length is shorter. Therefore, the channel length C1 of the first gate trench portion 40-1 is greater than the channel length C2 of the second gate trench portion 40-2. Accordingly, the threshold voltage of the first gate trench portion 40-1 is greater than the threshold voltage of the second gate trench portion 40-2.

In this way, by controlling the depth of the top ends of the gate conducting portions 44, it is possible to control the threshold voltage of each gate trench portion 40. Accordingly, it is possible to set a suitable threshold voltage for each gate trench portion 40 according to the use, function, or the like of the gate trench portion 40.

The gate trenches 41 of the first gate trench portion 40-1 and the second gate trench portion 40-2 may have different depths from the front surface 11 of the semiconductor substrate 10. Specifically, the gate trench 41 of a gate trench portion 40 that is to have a larger threshold voltage is formed to be deeper. Gate conducting portions 44 having the same length are then formed respectively in the gate trenches 41. In this way, the depth of the top end of each gate conducting portion 44 differs according to the depth of the gate trench 41. With this example, it is possible to adjust the threshold voltage of each gate trench portion 40 while making the manufacturing process more efficient by simultaneously forming each of the gate conducting portions 44.

Furthermore, the plurality of gate trenches 41 with different depths may be formed by etching the front surface 11 of the semiconductor substrate 10 using a mask that has a plurality of openings with different areas. When the area of an opening of the mask is larger, a deeper gate trench 41 can be formed. In this way, it is possible to adjust the threshold voltage of each gate trench portion 40 while making the manufacturing process more efficient by simultaneously forming each of the gate trenches 41 with different depths.

Figure 12:
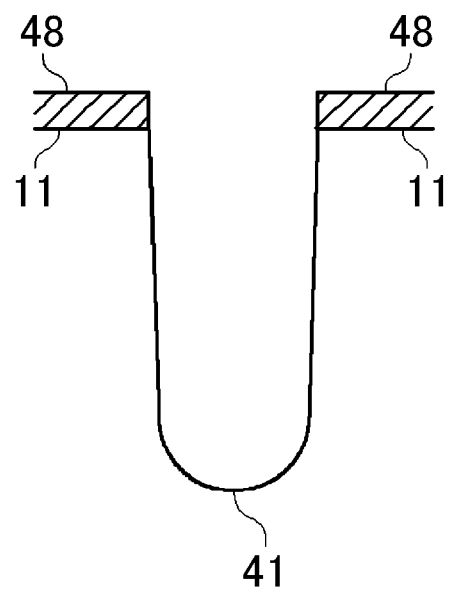
FIG. 12 shows an exemplary process for forming the shoulder portion 33.
Figure 12:
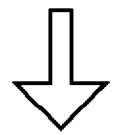
Figure 12:
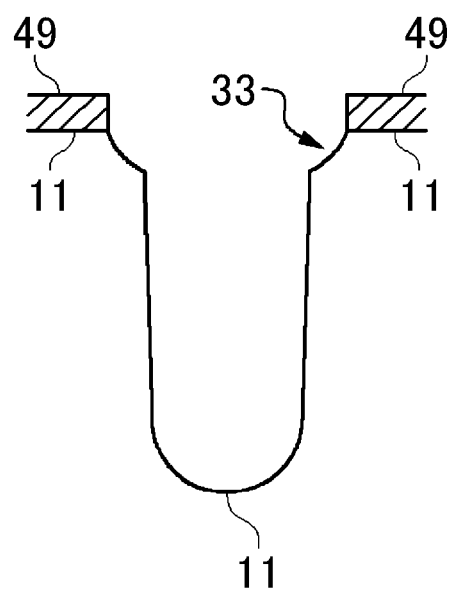

FIG. 12 shows an exemplary process for forming the shoulder portion 33. As described above, the gate trench 41 is formed by anisotropically etching the front surface 11 of the semiconductor substrate 10 using the first mask 48. Next, wet etching is performed on the first mask 48, to form the second mask 49 in which the areas of the mask openings have been enlarged. The regions of the front surface 11 where the shoulder portions 33 are to be formed are exposed in the openings of the second mask 49. Wet etching of the front surface 11 of the semiconductor substrate 10 is then performed using the second mask 49. In this way, it is possible to form shoulder portions 33 having more gentle slopes than the side walls of the gate trench 41.

Figure 13:
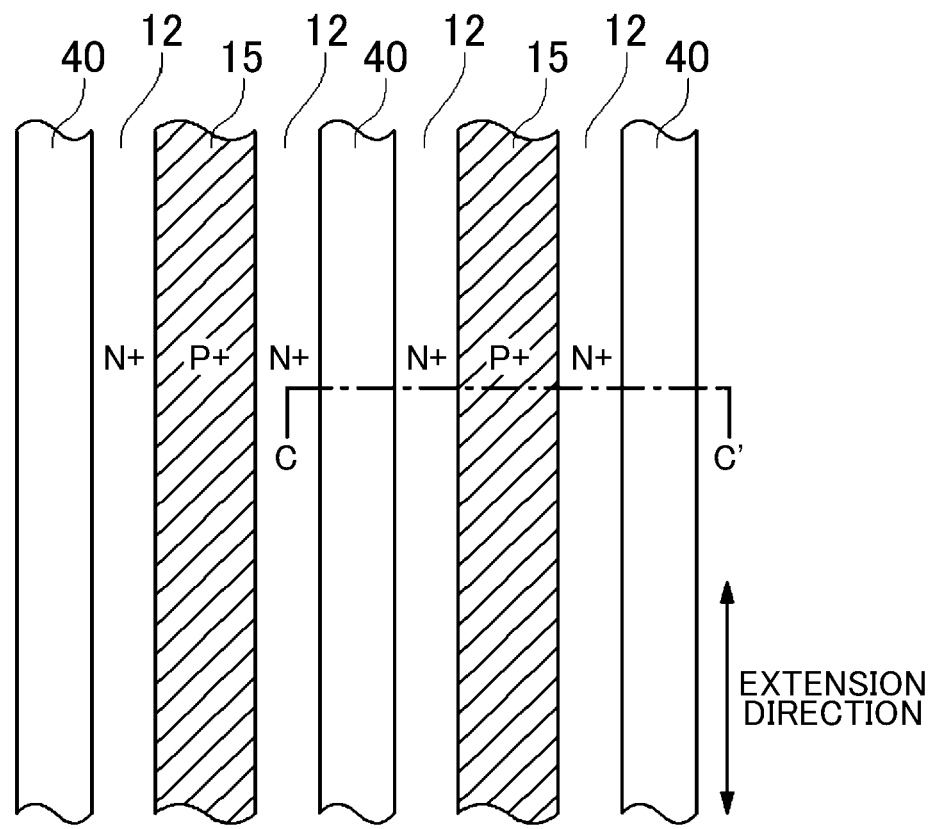
FIG. 13 shows a portion of the front surface of a semiconductor device 100 according to a third embodiment.

FIG. 13 shows a portion of the front surface of a semiconductor device 100 according to a third embodiment. The semiconductor device 100 of this example includes a plurality of gate trench portions 40 that extend in a prescribed extension direction in the front surface of the semiconductor substrate. The gate trench portions 40 are the same as the gate trench portions 40 according to any one of the embodiments described in FIGS. 1 to 12.

Here, N+ type emitter regions 12 are formed in each region sandwiched by respective gate trench portions 40 in the front surface of the semiconductor substrate. The emitter regions 12 are formed as stripe shapes in regions adjacent to the gate trench portions 40. In this example, the base region 14 is not exposed in the regions sandwiched by respective gate trench portions 40 in the front surface of the semiconductor substrate.

The contact regions 15 of this example are formed inside the semiconductor substrate and are not exposed on the front surface of the semiconductor substrate. The contact regions 15 are formed as stripes that are parallel to the gate trench portions 40 in the semiconductor substrate. Contact openings that expose the contact regions 15 are formed in the emitter regions 12. Plugs that connect the contact regions 15 to the emitter electrodes 52 are formed within these contact openings.

Figure 14:
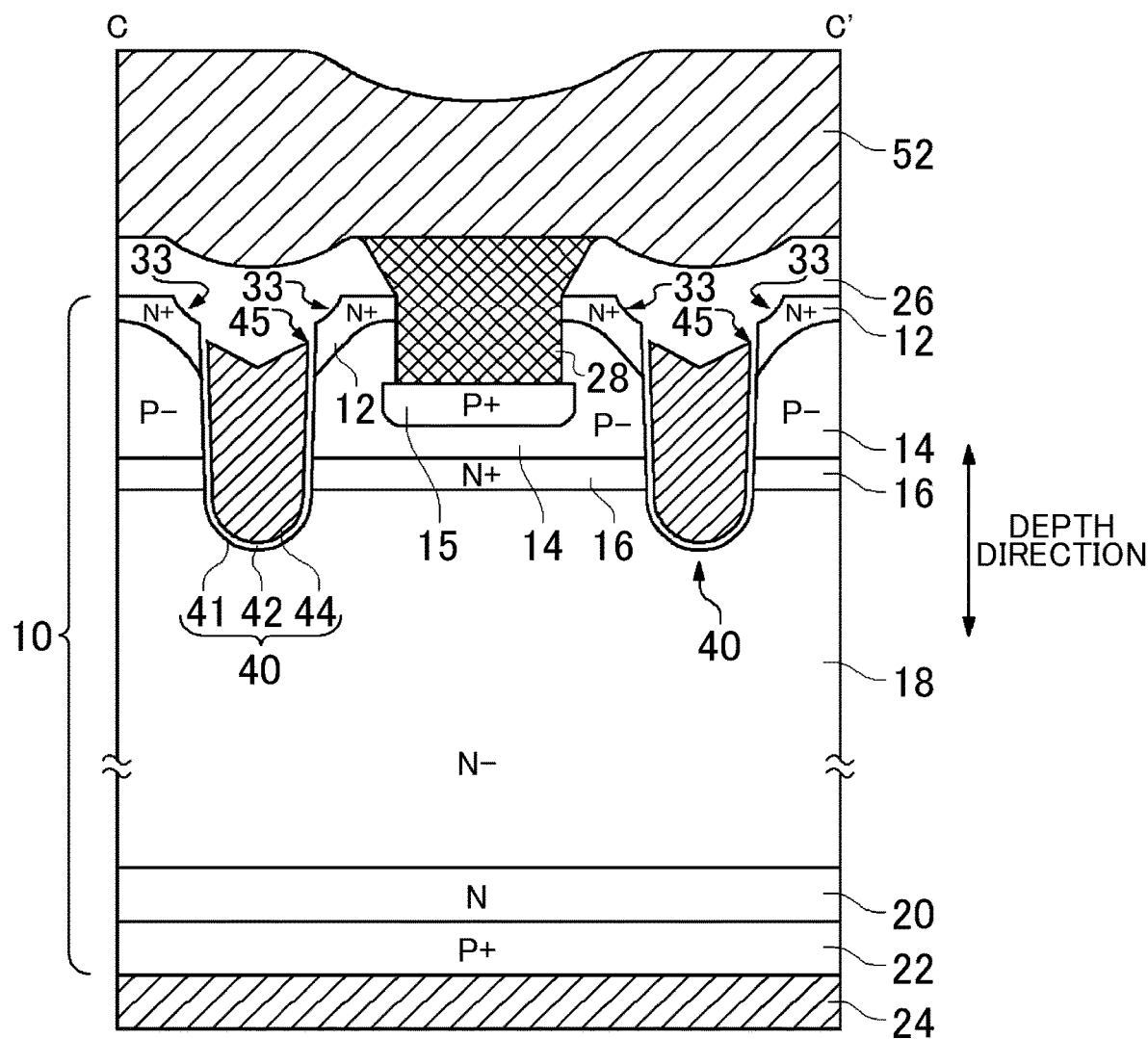
FIG. 14 shows a C-C' cross section from FIG. 13.

FIG. 14 shows a C-C' cross section from FIG. 13. The C-C' cross section is perpendicular to the front surface of the semiconductor device 100 and perpendicular to the extension direction of the gate trench portions 40. In this example, in the region sandwiched by two gate trench portions 40, an emitter region 12 is formed near the top surface of the semiconductor substrate 10 and a base region 14 is formed below the emitter region 12. Furthermore, the semiconductor device 100 of this example includes a plug 28. The contact region 15 is formed adjacent to the bottom surface of the plug 28. The remaining structure of the semiconductor device 100 may be the same as the structure shown in FIG. 2.

The plug 28 is formed penetrating through the interlayer insulating film 26 and the emitter region 12 between the two gate trench portions 40. The plug 28 may be arranged in the center of the region sandwiched by the two gate trench portions 40. The top end of the plug 28 is connected to the emitter electrode 52, and the bottom end of the plug 28 is arranged within the base region 14. The plug 28 may be formed of a material including tungsten, for example.

The contact region 15 is formed within the base region 14. The contact region 15 of this example is entirely surrounded by the base region 14. The contact region 15 is formed in contact with the bottom end of the plug 28. With this structure, it is possible to decrease the contact resistance between the emitter electrode 52 and the semiconductor region. Particularly when making the semiconductor device 100 more fine, the width of the mesa sandwiched between gate trench portions 40 becomes smaller and the contact area between the emitter electrode 52 and the semiconductor region is reduced. In contrast to this, with the present example, the contact resistance can be kept low even when the semiconductor device 100 is made more fine, by providing the plug 28.

Furthermore, the semiconductor device 100 may further include an N+ type accumulation region 16. The accumulation region 16 has a higher impurity concentration than the drift region 18. The accumulation region 16 is formed between the base region 14 and the drift region 18 in regions between two gate trench portions 40. With this configuration, the carrier accumulation effect is strengthened and it is possible to improve the tradeoff between the ON voltage and the turn-OFF loss. The accumulation region 16 may be applied in the semiconductor devices 100 according to the first and second embodiments described in FIGS. 1 to 12.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The terms "up" and "down" in the Specification and Claims refer to directions that are opposite each other. It should be noted that the term "up" is not limited to a direction that is opposite the direction of gravity, and that the term "down" is not limited to the direction of gravity.

LIST OF REFERENCE NUMERALS

10: semiconductor substrate, 11: front surface. 12: emitter region. 14: base region. 15: contact region. 16: accumulation region, 18: drift region, 20: buffer region, 22: collector region, 24: collector electrode, 26: interlayer insulating film, 28: plug, 33: shoulder portion, 34: bottom end, 40: gate trench portion, 41: gate trench, 42: insulating film, 44: gate conducting portion, 45: top end, 46: portion, 47: conductive material, 48: first mask, 49: second mask, 52: emitter electrode, 100: semiconductor device

What is claimed is:

1. A manufacturing method for manufacturing a semiconductor device, comprising:
  forming a gate trench in a front surface of a semiconductor substrate the gate trench extending in an extension direction in the front surface of the semiconductor substrate;
  forming a gate conducting portion that is provided within the gate trench, has a top end that is provided at a position deeper than the front surface of the semiconductor substrate, and is insulated from the semiconductor substrate; and
  forming a plurality of first regions that are adjacent to the gate trench in the front surface of the semiconductor substrate and have a higher impurity concentration than the semiconductor substrate, by using the gate conducting portion as a mask and injecting impurities into a side wall of the gate trench, the plurality of first regions being alternately formed with a plurality of second regions in the extension direction in the front surface of the semiconductor substrate, the plurality of second regions having a different conduction type than the plurality of first regions and are formed on a front surface side of a third region that is formed on a back surface side of each of the plurality of first regions and each of the plurality of second regions, the third region having a different conduction type than the plurality of first regions, wherein
  the forming the gate trench includes providing, on a side wall of the gate trench between the top end of the gate conducting portion and the front surface of the semiconductor substrate, a shoulder portion that has an average slope, relative to a direction of the semiconductor substrate, that is greater than a slope of the side wall of the gate trench at a position opposite the top end of the gate conducting portion,
  a portion of the plurality of first regions that contact the gate trench are formed as a deepest portion of the plurality of first regions,
  each of the plurality of first regions and the plurality of second regions include a side surface in direct contact with the gate trench, and a bottom surface that intersects with the side surface, the intersection of the side surface and the bottom surface being provided at a position deeper than other portions of the bottom surface,
  the intersection of the side surface and the bottom surface of the plurality of second regions adjacent to the gate trench are deeper than the intersection of the side surface and the bottom surface of the plurality of first regions adjacent to the gate trench,
  the bottom surface of the plurality of second regions at a center between the gate trench and an adjacent gate trench is deeper than the bottom surface of the plurality of first regions at a center between the gate trench and the adjacent gate trench, and
  a first length difference between a depth at the intersection of the side surface and the bottom surface of the plurality of second regions and a depth at the intersection of the side surface and the bottom surface of the plurality of first regions is greater than a second length difference between a depth of the bottom surface of the plurality of second regions at the center between the gate trench and an adjacent gate and a depth of the bottom surface of the plurality of first regions at the center between the gate trench and the adjacent gate.

2. The manufacturing method according to claim 1, wherein
the forming the plurality of first regions includes injecting impurities into the side wall of the gate trench from a direction having a slope relative to a depth direction of the semiconductor substrate.

* * * * *